(12) United States Patent
Kim et al.

(10) Patent No.: US 12,244,303 B2
(45) Date of Patent: Mar. 4, 2025

(54) POWER SUPPLY SWITCH CIRCUIT AND SWITCH DRIVER CIRCUIT

(71) Applicant: SAMSUNG ELECTRO-MECHANICS CO., LTD., Suwon-si (KR)

(72) Inventors: Jeonghoon Kim, Suwon-si (KR); Jongok Ha, Suwon-si (KR); Youngwong Jang, Suwon-si (KR); Shinichi Iizuka, Suwon-si (KR); Hyejin Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 58 days.

(21) Appl. No.: 18/310,723

(22) Filed: May 2, 2023

(65) Prior Publication Data
US 2024/0195410 A1    Jun. 13, 2024

(30) Foreign Application Priority Data
Dec. 8, 2022    (KR) .................. 10-2022-0170962

(51) Int. Cl.
*H03K 17/687*    (2006.01)

(52) U.S. Cl.
CPC . *H03K 17/6871* (2013.01); *H03K 2217/0081* (2013.01)

(58) Field of Classification Search
CPC ....... H03K 17/6871; H03K 2217/0081; H03K 17/284; H03K 5/135; H03F 1/0227; H03F 1/523
See application file for complete search history.

(56) References Cited

U.S. PATENT DOCUMENTS

| | | |
|---|---|---|
| 7,973,595 B2 | 7/2011 | Kimura |
| 9,300,299 B1 | 3/2016 | Lin |
| 10,505,579 B2 | 12/2019 | Jo et al. |
| 11,009,902 B1 * | 5/2021 | Miwa .................. G11C 11/4074 |

FOREIGN PATENT DOCUMENTS

| | | | |
|---|---|---|---|
| JP | 2000-22513 A | 1/2000 | |
| WO | WO-0245232 A1 * | 6/2002 | ............. H02H 9/001 |

OTHER PUBLICATIONS

Korean Office Action issued on Jul. 18, 2024, in counterpart Korean Patent Application No. 10-2022-0170962 (4 pages in English, 4 pages in Korean).

* cited by examiner

*Primary Examiner* — Metasebia T Retebo
(74) *Attorney, Agent, or Firm* — NSIP Law

(57) ABSTRACT

A power supply switch circuit is disclosed. The power supply switch circuit includes a first switch configured to switch a supply of a first power supply voltage to a power supply terminal of a power amplifier; and a switch driving circuit including a first transistor configured to turn on the first switch, and a second transistor configured to turn off the first switch. The switch driving circuit may further include a first resistor that is positioned on a turn-on path formed between the first transistor and the first switch when the first transistor is turned on.

13 Claims, 18 Drawing Sheets

FIG. 4

| SW2_CTRL (Bit2) | SW1_CTRL (Bit1) | SW2 | SW1 |
|---|---|---|---|
| 0 | 0 | OFF | OFF |
| 0 | 1 | OFF | ON |
| 1 | 0 | ON | OFF |
| 1 | 1 | OFF | OFF |

FIG. 7

| bit2 | bit1 | $V_{LCG}$ | $V_{LCS}$ |
|---|---|---|---|
| 0 | 0 | 0 | 0 |
| 0 | 1 | 0 | 1 |
| 1 | 0 | 1 | 0 |
| 1 | 1 | 0 | 0 |

POWER SUPPLY SWITCH CIRCUIT AND SWITCH DRIVER CIRCUIT

CROSS-REFERENCE TO RELATED APPLICATIONS

This application claims the benefit under 35 USC § 119(a) of Korean Patent Application No. 10-2022-0170962 filed on Dec. 8, 2022, in the Korean Intellectual Property Office, the entire contents of which are incorporated herein by reference for all purposes.

BACKGROUND

1. Field

The following description relates to a power supply switch circuit and a switch driver circuit.

2. Description of Related Art

In wireless communication standards, a plurality of communication standards such as 2G, Wi-Fi, Bluetooth, 3G, 4G, and 5G, as examples, may be implemented in one device (for example, a smartphone). As the plurality of communication standards are implemented in one device, a power amplifier to output a transmission signal may be implemented for each communication standard. That is, in order to output a signal that conforms to the plurality of communication standards, a plurality of power amplifiers corresponding to the plurality of communication standards may be desired.

The power amplifier operates by receiving power from an external source, and typically, a separate power supply integrated circuit (IC) that supplies power to one power amplifier may be used. In an example, four power supply ICs may be used to operate four power amplifiers. When one of the plurality of communication standards is used, another communication standard may not be simultaneously used. For example, when the 4G communication standard is used, the 3G communication standard may not be used. Accordingly, a power supply IC corresponding to the unused communication standard should be effectively used for other communication standards.

The above information disclosed in this Background period is only for enhancement of understanding of the background, and therefore it may contain information that does not form the prior art that is already known in this country to a person of ordinary skill in the art.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a power supply switch circuit includes a first switch configured to switch a supply of a first power supply voltage to a power supply terminal of a power amplifier; and a switch driving circuit including a first transistor configured to turn on the first switch, and a second transistor configured to turn off the first switch, wherein the switch driving circuit further includes a first resistor positioned on a turn-on path that is formed between the first transistor and the first switch when the first transistor is turned on.

A turn-on rising period of the first switch may be longer than a turn-off falling period of the first switch.

The turn-on rising period of the first switch may be determined by a value of the first resistor and a capacitance value formed at a control terminal of the first switch.

The first resistor may not be positioned on a turn-off path that is formed between the second transistor and the first switch when the second transistor is turned on.

A first terminal of the second transistor may be connected to a second power supply voltage, and a second terminal of the second transistor may be connected to a control terminal of the first switch, a second terminal of the first transistor may be connected to a ground, and the first resistor may be connected between a second terminal of the first transistor and the control terminal of the first switch.

The first switch may be a p-type transistor, and a control signal that controls the first switch may be input to a control terminal of the first transistor and a control terminal of the second transistor.

A first terminal of the second transistor may be connected to a ground, a second terminal of the second transistor may be connected to a control terminal of the first switch, a first terminal of the first transistor may be connected to a second power supply voltage, and the first resistor may be connected to a second terminal of the first transistor and the control terminal of the first switch.

The first switch may be an n-type transistor, and a control signal that controls the first switch may be input to a control terminal of the first transistor and a control terminal of the second transistor.

The switch driving circuit may further include a second switch connected in parallel to a first terminal and a second terminal of the first resistor, and the second switch may be configured to turn off when the first transistor is turned on and may be configured to turn on when the second transistor is turned on.

The first resistor may be connected between a node where the first transistor and the second transistor may be connected to each other and a control terminal of the first switch.

The first switch may include a plurality of transistors connected in parallel with each other, and after at least one transistor among the plurality of transistors is turned on first, at least one transistor different from the at least one transistor among the plurality of transistors may be turned on.

The power supply switch circuit may further include a second switch configured to switch the supply of the second power supply voltage to the power supply terminal of the power amplifier, and when the first switch is turned off and the second switch is turned on, the second switch is turned on after the first switch is turned off.

The power supply switch circuit may further include a delay circuit configured to delay a first logic signal that controls the first switch and delay a second logic signal that controls the second switch.

The delay circuit may include a first delay circuit including a first delay element configured to delay the first logic signal, and a first AND gate that receives the first logic signal and a signal delayed by the first delay element, and a second delay circuit including a second delay element configured to delay the second logic signal, and a second AND gate that receives the second logic signal and a signal delayed by the second delay element.

In a general aspect, a switch driving circuit includes a first transistor configured to turn on a first switch that switches a supply of a power supply voltage to a power supply terminal of a power amplifier; a second transistor configured to turn off the first switch; and a first resistor positioned on a turn-on path formed between the first transistor and the first switch when the first switch is turned on.

The switch driving circuit may further include a second switch connected in parallel to a first terminal and a second terminal of the first resistor, wherein the second switch is turned off when the first transistor is turned on and is turned on when the second transistor is turned on.

A turn-on rising period of the first switch may be longer than a turn-off falling period of the first switch.

In a general aspect, a power supply switch circuit includes an inverter configured to control a turn-on rising time and a turn-off falling time of a switch, the inverter including a first transistor configured to receive a first control signal and turn on or turn off based on a high level or a low level of the first control signal; a second transistor configured to receive the first control signal and turn on or turn off based on the high level or the low level of the first control signal; and a resistor, disposed on a turn-on path between the first transistor and the switch or between the second transistor and the switch, and configured to increase the turn-on rising time of the switch.

The first transistor may be a p-type transistor, and the second transistor may be a n-type transistor.

Other features and aspects will be apparent from the following detailed description, the drawings, and the claims.

BRIEF DESCRIPTION OF DRAWINGS

FIG. 4 illustrates a logic table, in accordance with one or more embodiments.

FIG. 7 illustrates an input and output logic table of the example logic circuit of FIG. 6.

Figure 1:
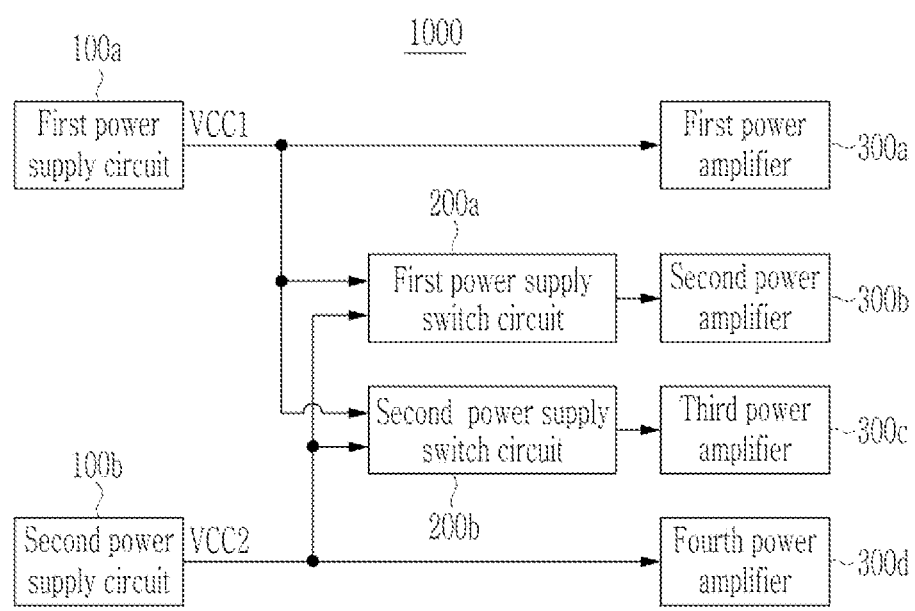
FIG. 1 illustrates a block diagram of an example transmitter system, in accordance with one or more embodiments.

Throughout the drawings and the detailed description, unless otherwise described or provided, the same drawing reference numerals may be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure. For example, the sequences of operations described herein are merely examples, and are not limited to those set forth herein, but may be changed as will be apparent after an understanding of the disclosure, with the exception of operations necessarily occurring in a certain order. Also, descriptions of features that are known after an understanding of the disclosure may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure.

The terminology used herein is for describing various examples only and is not to be used to limit the disclosure. The articles "a," "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure. Terms, such as those defined in commonly used dictionaries, are to be interpreted as having a meaning that is consistent with their meaning in the context of the relevant art and the disclosure and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

Throughout the specification, the RF signal may have a format according to other random wireless and wired protocols designated by Wi-Fi (IEEE 802.11 family, etc.), WiMAX (IEEE 802.16 family, etc.), IEEE 802.20, long term evolution (LTE), Evolution-Data Optimized (Ev-DO), high-speed packet access plus (HSPA+), high-speed downlink packet access plus (HSDPA+), high-speed uplink packet access plus (HSUPA+), Enhanced Data GSM Evolution (EDGE), Global System for Mobile communication (GSM), Global Positioning System (GPS), General Packet Radio Service (GPRS), Code Division Multiple Access (CDMA), Time Division Multiple Access (TDMA), digital enhanced cordless communication (DECT), Bluetooth, third generation (3G), fourth generation (4G), fifth generation (5G), and subsequent ones.

One or more examples may provide a power supply switch circuit that switches at least two power supply voltages to supply them to a power amplifier.

FIG. 1 illustrates a block diagram of an example transmitter system 1000, in accordance with one or more embodiments.

As illustrated in FIG. 1, an example transmitter system 1000, in accordance with one or more embodiments, may include respective first and second power supply circuits 100a and 100b, respective first and second power supply switch circuits 200a and 200b, and respective first to fourth power amplifiers 300a to 300d.

FIG. 1 illustrates an example in which the transmitter system 1000 is configured with two power supply circuits, four power amplifiers, and two power supply switch circuits. However, the numbers of the power supply circuits, the power amplifiers, and the power supply switch circuits are not limited thereto, and any number of power supply circuits, power amplifiers, and power supply switch circuits may be implemented.

The first power supply circuit 100a generates and outputs a first power supply voltage VCC1. In an example, the first power supply voltage VCC1 may be applied to the power supply terminal of the first power amplifier 300a, the second power amplifier 300b, or the third power amplifier 300c. To support an average power tracking (APT) mode, a value of the first power supply voltage VCC1 may vary according to an envelope of an RF signal inputted to the first power amplifier 300a, the second power amplifier 300b, or the third power amplifier 300c.

The second power supply circuit 100b generates and outputs a second power supply voltage VCC2. In an example, the second power supply voltage VCC2 may be applied to a power supply terminal of the second power amplifier 300b, the third power amplifier 300c, or the fourth power amplifier 300d. To support an average power tracking (APT) mode, a value of the second power supply voltage VCC2 may vary according to an envelope of an RF signal inputted to the second power amplifier 300b, the third power amplifier 300c, or the fourth power amplifier 300d.

In a non-limited example, each of the first and second power supply circuits 100a and 100b may be implemented as a power management integrated circuit (PM IC).

The first power supply switch circuit 200a may receive the first power supply voltage VCC1 from the first power supply circuit 100a, and may receive the second power supply voltage VCC2 from the second power supply circuit 100b. The first power supply switch circuit 200a may select one of the input first and second power supply voltages VCC1 and VCC2 and output it to a power supply terminal of the second power amplifier 300b. In an example, when the first power amplifier 300a does not operate, the first power supply switch circuit 200a may select the first power supply voltage VCC1, and output it to a power supply terminal of the second power amplifier 300b. Additionally, when the fourth power amplifier 300d does not operate, the first power supply switch circuit 200a may select the second power supply voltage VCC2 and output it to a power supply terminal of the second power amplifier 300b.

The second power supply switch circuit 200b receives the first power supply voltage VCC1 from the first power supply circuit 100a, and receives the second power supply voltage VCC2 from the second power supply circuit 100b. The second power supply switch circuit 200b may select one of the input first and second power supply voltages VCC1 and VCC2 and output (supply) it to a power supply terminal of the third power amplifier 300c. In an example, when the first power amplifier 300a does not operate, the second power supply switch circuit 200b may select the first power supply voltage VCC1 and output it to the power supply terminal of the third power amplifier 300c. Additionally, when the fourth power amplifier 300d does not operate, the second power supply switch circuit 200b may select the second power supply voltage VCC2 and output it to the power supply terminal of the third power amplifier 300c.

The first power amplifier 300a may operate by receiving the first power supply voltage VCC1 from the first power supply circuit 100a, and amplify and output an input radio frequency (RF) signal. In an example, the input RF signal of the first power amplifier 300a may be an RF signal for the first communication standard.

The second power amplifier 300b may operate by receiving a power supply voltage (that is, first power supply voltage VCC1 or second power supply voltage VCC2) selected by the first power supply switch circuit 200a, and amplify and output an input RF signal. In an example, the input RF signal of the second power amplifier 300b may be an RF signal for the second communication standard.

The third power amplifier 300c may operate by receiving a power supply voltage (that is, first power supply voltage VCC1 or second power supply voltage VCC2) selected by the second power supply switch circuit 200b, and amplify and output an input RF signal. In an example, the input RF signal of the third power amplifier 300c may be an RF signal for the third communication standard.

The fourth power amplifier 300d may operate by receiving the second power supply voltage VCC2 from the second power supply circuit 100b, and amplify and output an input radio frequency (RF) signal. In an example, the input RF signal of the fourth power amplifier 300d may be an RF signal for the fourth communication standard.

In an example, the, the first to fourth communication standards may be different communication standards, and each thereof may be, as examples, one of 2G, Wi-Fi, Bluetooth, 3G, 4G, and 5G communication standards. In an example, the first to fourth communication standards may be communication standards that define different bands in the 5G communication standard.

In an example, by sharing the power supply voltage through the power supply switch circuit, the number of power supply circuits may be reduced. Generally, when there are four power amplifiers, four power supply circuits may be used. However, in FIG. 1, the number of the power supply circuits may be reduced to two by using the power supply switch circuit. Hereinafter, a detailed configuration and operation method of a power supply switch circuit such as the first and second power supply switch circuits 200a and 200b will be described.

Figure 2:
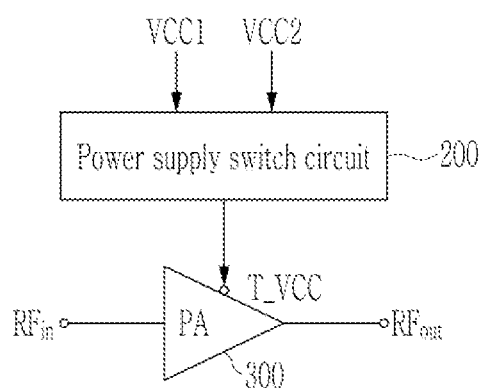
FIG. 2 illustrates a connection relationship between an example power supply switch circuit and an example power amplifier, in accordance with one or more embodiments.

FIG. 2 illustrates a connection relationship between an example power supply switch circuit 200 and an example power amplifier 300 in accordance with one or more embodiments.

Referring to FIG. 2, the power supply switch circuit 200 receives the first power supply voltage VCC1 and the second power supply voltage VCC2 as inputs, and selects one of the received first and second power supply voltages VCC1 and VCC2 to be output to a power supply terminal T_VCC of the power amplifier 300. In an example, the power supply switch circuit 200 may be the first power supply switch circuit 200a or the second power supply switch circuit 200b of FIG. 1.

In FIG. 1 and FIG. 2, the power supply switch circuit 200 is shown to receive two power supply voltages, but may receive at least two power supply voltages. In this example, the power supply switch circuit 200 may select one of at least two power supply voltages.

The power amplifier 300 includes an input terminal RFin, an output terminal RFout, and the power supply terminal T_VCC. An RF signal is inputted to the input terminal RFin, and an amplified signal is outputted from the output terminal Rout. The power supply voltage VCC1 or VCC2 is applied to the power supply terminal T_VCC, and the power amplifier 300 is operated based on the applied power supply voltage VCC1 or VCC2. In an example, the power amplifier 300 may be implemented as a transistor. When the power amplifier 300 is implemented as a bipolar junction transistor (BJT), the input terminal RFin may be a base, and the power supply terminal T_VCC may be a collector or an emitter. When the power amplifier 300 is implemented as a field effect transistor (FET), the input terminal RFin may be a gate, and the power supply terminal T_VCC may be a drain or a source.

The power supply switch circuit 200 and the power amplifier 300 of FIG. 2 may be combined to implement a single power amplifier module.

Figure 3:
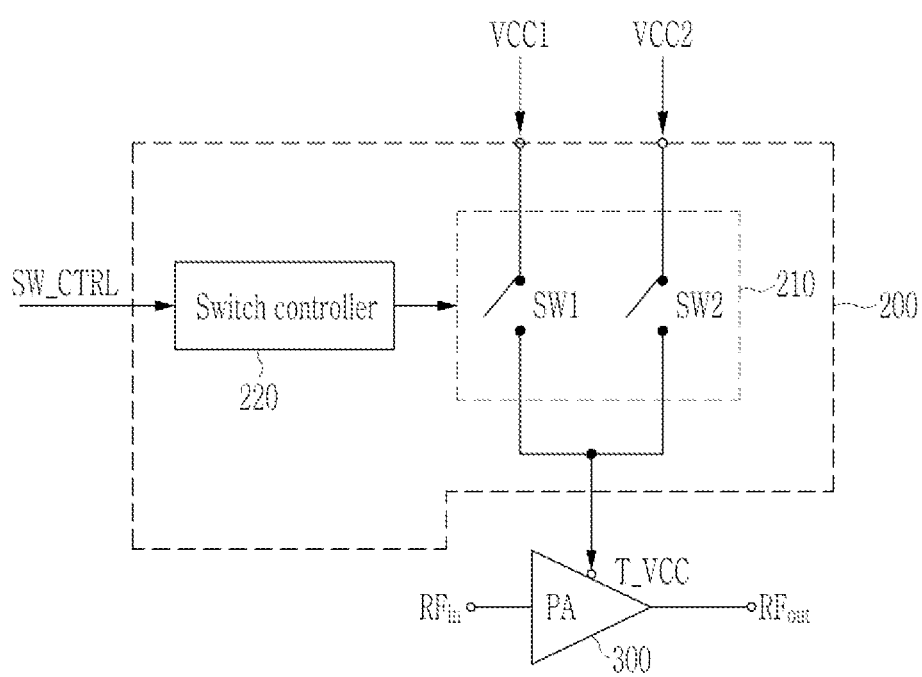
FIG. 3 illustrates an internal configuration of an example power supply switch circuit of FIG. 2.

FIG. 3 illustrates an internal configuration of the example power supply switch circuit 200 of FIG. 2, in accordance with one or more embodiments.

Referring to FIG. 3, the power supply switch circuit 200, in accordance with one or more embodiments, may include a switch circuit 210 and a switch controller 220. The switch circuit 210 may include a first switch SW1 and a second switch SW2. The first switch SW1 may switch the supply of the first power supply voltage VCC1 to the power supply terminal T_VCC of the power amplifier 300, and the second switch SW2 may switch the supply of the second power supply voltage VCC2 to the power supply terminal T_VCC of the power amplifier 300. In an example, the first switch SW1 may be connected between the first power supply circuit 100a and the power supply terminal T_VCC of the power amplifier 300, and the second switch SW2 may be connected between the second power supply circuit 100b and the power supply terminal T_VCC of the power amplifier 300.

The switch controller 220 may receive a switch control signal SW_CTRL from an external source, and drive the switch circuit 210 in response to the switch control signal SW_CTRL. In an example, the switch control signal SW_CTRL may be a bit signal (a digital signal), for example, a 2-bit signal. The switch control signal SW_CTRL may include a first switch control signal SW1_CTRL that controls the first switch SW1 and a second switching control signal SW2_CTRL that controls the second switch SW2. The first switch control signal SW1_CTRL may be bit 1, and the second switch control signal SW2_CTRL may be bit 2.

When the first switch control signal SW1_CTRL is a low signal and the second switch control signal SW2_CTRL is low, the first switch SW1 may be turned off and the second switch SW2 may be turned off. Accordingly, both the first and second power supply voltages VCC1 and VCC1 are not applied to the power supply terminal T_VCC of the power amplifier 300.

When the first switch control signal SW1_CTRL is High and the second switch control signal SW2_CTRL is Low, the first switch SW1 may be turned on and the second switch SW2 may be turned off. Accordingly, the first power supply voltage VCC1 may be applied to the power supply terminal T_VCC of the power amplifier 300 through the first switch SW1.

When the first switch control signal SW1_CTRL is Low and the second switch control signal SW2_CTRL is High, the first switch SW1 may be turned off and the second switch SW2 may be turned on. Accordingly, the second power supply voltage VCC2 may be applied to the power supply terminal T_VCC of the power amplifier 300 through the second switch SW2.

When the first switch control signal SW1_CTRL is High and the second switch control signal SW2_CTRL is High, the first switch SW1 may be turned off and the second switch SW2 may be turned off. According to one embodiment, that is, the situation where the first and second switches SW1 and SW2 are simultaneously turned on may be prevented.

Referring to FIG. 4 below, even when the bit signal is 11, the first and second switches SW1 and SW2 may be turned off. When the first and second switches SW1 and SW2 are simultaneously turned on, a current path may be formed from the first power supply circuit 100a to the second power supply circuit 100b or from the second power supply circuit 100b to the first power supply circuit 100a. Accordingly, the first power supply circuit 100a or the second power supply circuit 100b may be damaged. To prevent this, according to one embodiment, the first and second switches SW1 and SW2 may not be simultaneously turned on.

FIG. 4 illustrates an example logic table, in accordance with one or more embodiments.

In FIG. 4, Bit1 and Bit2 are the switch control signals SW1_CTRL and SW2_CTRL that are input to the switch controller 220. As shown in FIG. 4, when the external bit signal is 00 and 11, both first and second switches SW1 and SW2 are in a turn-off state. The switch controller 220 may include a logic circuit having a logic table such as FIG. 4, which is described in more detail below.

When the power supply voltage applied to the power supply terminal T_VCC changes from the first power supply voltage VCC1 to the second power supply voltage VCC2, the power switch circuit 200 may control the two power supply voltages VCC1 and VCC2 so that they do not overlap. Additionally, when the power supply voltage applied to the power supply terminal T_VCC changes from the second power supply voltage VCC2 to the first power supply voltage VCC1, the power switch circuit 200 may control the two power supply voltages VCC1 and VCC2 so that they do not overlap. That is, the power supply switch circuit 200 generates a control signal such that two power supply voltages are simultaneously not supplied to the power supply terminal T_VCC of the power amplifier 300 when switching between two power supply voltages. This is explained from the switch point of view below. On the other hand, when the first switch SW1 changes from the turn-on state to the turn-off state and the second switch SW2 changes from the turn-off state to the turn-on state, the switch controller 220 may delay the turn-on of the second switch SW2. Additionally, even when the second switch SW2 changes from the turn-on state to the turn-off state and the first switch SW1 changes from the turn-off state to the turn-on state, the switch controller 220 may delay the turn-on of the first switch SW1. A rising time occurs when the switch is turned on, and a falling time occurs when the switch is turned off, and due to this, a period (an overlapping-on period) in which the first switch SW1 and the second switch SW2 are simultaneously turned on may occur. In the overlapping-on period, a current path may occur between the first power supply circuit 100a and the second power supply circuit 100b, and an overcurrent may occur due to this. To prevent this, the switch controller 220 according to one embodiment may generate an on/off time difference between the first and second switches SW1 and SW2. In an example, the switch controller 220 may first operate the switch to be turned off and then operate the switch to be turned on with a time difference.

Figure 5:
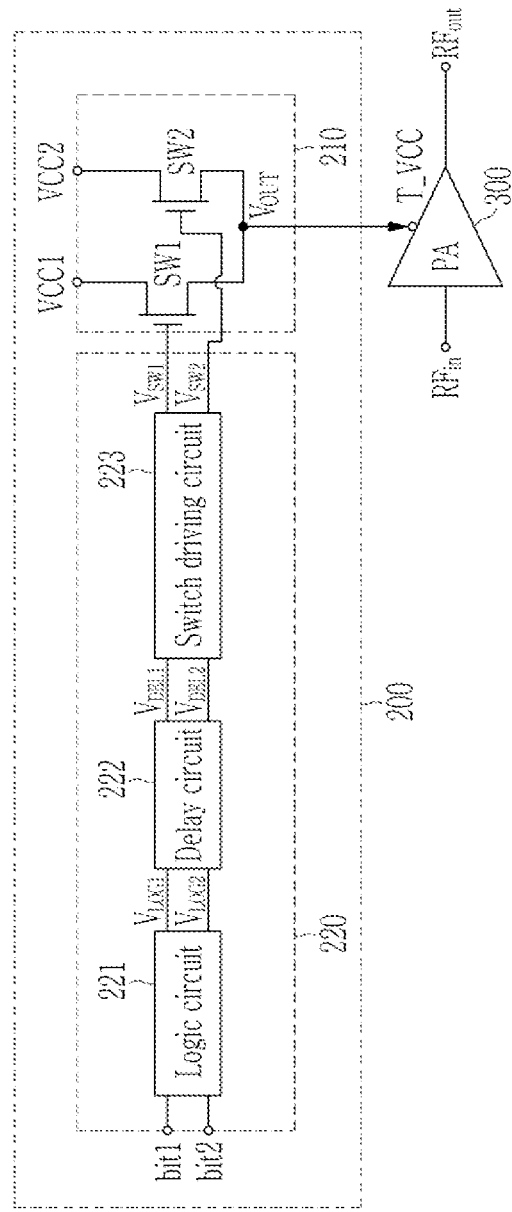
FIG. 5 illustrates an internal configuration of an example switch controller, in accordance with one or more embodiments.

FIG. 5 illustrates an internal configuration of an example switch controller 220, in accordance with one or more embodiments.

As illustrated in FIG. 5, an example switch controller 220, in accordance with one or more embodiments, may include a logic circuit 221, a delay circuit 222, and a switch driving circuit 223. In FIG. 5, as one example, the first and second switches SW1 and SW2 may be field effect transistors (FET), but they may be formed of various transistors such as a bipolar transistor. On the other hand, the first and second switches SW1 and SW2 may be a p-type transistor or an n-type transistor. In FIG. 5, the voltage of the power supply terminal T_VCC is represented as $V_{out}$. Hereinafter, the voltage supplied by the power supply switch circuit 200 to the power supply terminal T_VCC is referred to as 'a power supply terminal voltage $V_{OUT}$'.

The logic circuit 221 receives bit signals Bit1 and Bit2 from an external source, and generates and outputs logic signals $V_{LOG1}$ and $V_{LOG2}$ in response to the bit signals Bit1 and Bit2. The first bit signal Bit1 and first logic signal $V_{LOG1}$ may be used to control the first switch SW1, and the second bit signal Bit2 and the second logic signal $V_{LOG2}$ may be used to control the second switch SW2.

Figure 6:
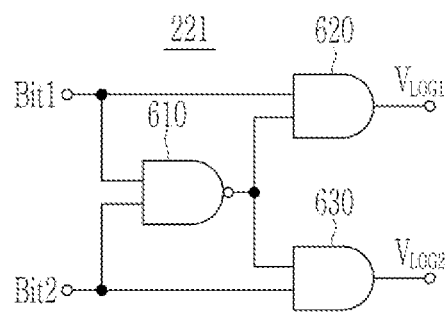
FIG. 6 illustrates an example logic circuit, in accordance with one or more embodiments.

FIG. 6 illustrates a logic circuit 221, in accordance with one or more embodiments.

As illustrated in FIG. 6, the logic circuit 221, in accordance with one or more embodiments, may include a NAND gate 610, a first AND gate 620, and a second AND gate 630.

The NAND gate 610 receives the first bit signal Bit1 and the second bit signal Bit2. The first AND gate 620 receives the output of the first bit signal Bit1 and the NAND gate 610 and outputs the first logic signal $V_{LOG1}$. Additionally, the second AND gate 630 receives the output of the second bit signal Bit2 and the NAND gate 610 and outputs the second logic signal $V_{LOG2}$.

Figure 7:
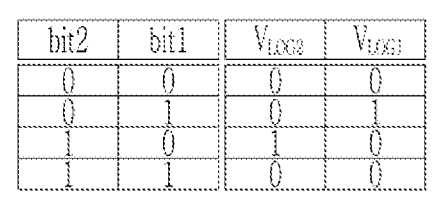

FIG. 7 illustrates an input and output logic table of the example logic circuit 221 of FIG. 6.

As illustrated in FIG. 7, the logic circuit 221 may generate and output four states in response to two bit signals. When the first logic signal $V_{LOG1}$ is 1, it means a High level, and in this example, the first switch SW1 is turned on. Additionally, when the first logic signal $V_{LOG1}$ is 0, it means a Low level, in this example, the first switch SW1 is turned off. Additionally, when the second logic signal $V_{LOG2}$ is 1, it means a High level, and in this example, the second switch SW2 is turned on. Additionally, when the second logic signal $V_{LOG2}$ is 0, it means a Low level, and in this example, the first switch SW1 is turned off. In the bit signal 01, the first logic signal $V_{LOG1}$ becomes a High level and the first switch SW1 is turned on. Additionally, in the bit signal 10, the second logic signal $V_{LOG2}$ becomes a High level, and the second switch SW2 is turned on. In the remaining examples, the first and second logic signals $V_{LOG1}$ and $V_{LOG2}$ become low levels, and both first and second switches SW1 and SW2 are turned off.

The delay circuit 222 receives the first and second logic signals $V_{LOG1}$ and $V_{LOG2}$ from the logic circuit 221, and outputs the delay signals $V_{DEL1}$ and $V_{DEL2}$ so that the overlapping-on period is not generated when switching between the first switch SW1 and the second switch SW2. The first delay signal $V_{DEL1}$ corresponds to the first logic signal $V_{LOG1}$, and the second delay signal $V_{DEL2}$ corresponds to the second logic signal $V_{LOG2}$.

Figure 8A:
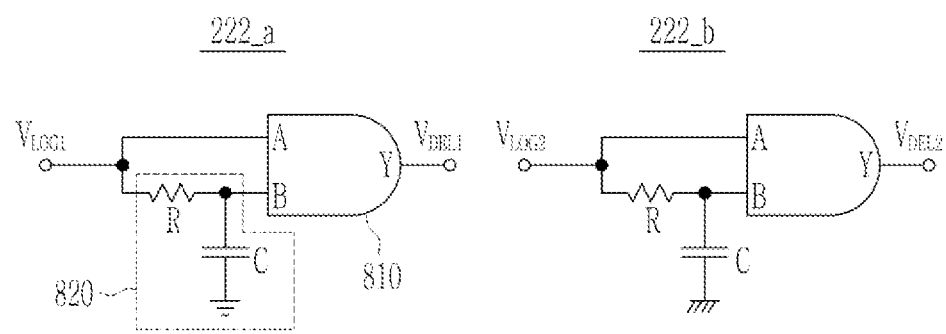
FIG. 8A illustrates an example delay circuit, in accordance with one or more embodiments.
Figure 8B:
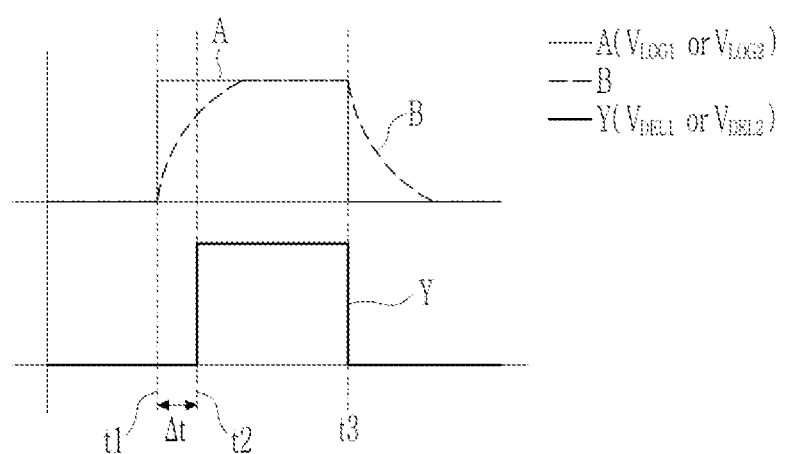
FIG. 8B is a graph illustrating input and output signal timing of an example delay circuit, in accordance with one or more embodiments.

FIG. 8A illustrates an example delay circuit 222, in accordance with one or more embodiments, and FIG. 8B is a graph illustrating input and output signal timing of the example delay circuit 222, in accordance with one or more embodiments.

As illustrated in FIG. 8A, the example delay circuit 222 may include a first delay circuit 222_a and a second delay circuit 222_b.

The first delay circuit 222_a receives the first logic signal $V_{LOG1}$ and outputs the first delay signal $V_{DEL1}$. The first delay circuit 222_a may include an AND gate 810 and a delay element 820. The delay element 820 may include a resistor R and a capacitor C. In the first delay circuit 222_a, A and B represent the input terminal of the AND gate 810, and Y represents the output terminal of the AND gate 810. The first logic signal $V_{LOG1}$ is input to the input terminal A of the AND gate 810. The capacitor C is connected between the input terminal B of the AND gate 810 and the ground. The first logic signal $V_{LOG1}$ is input to one terminal of the resistor R, and the other terminal of the resistor R is connected to the input terminal B of the AND gate 810. Here, the delay element 820 delays the first logic signal $V_{LOG1}$ by a predetermined time and outputs it to the input terminal B of the AND gate 810. An RC time constant value is determined by the value of the resistor R and the value of the capacitor C, and the signal is delayed by the RC time constant value. The delay element 820 is an element that delays a signal, and may be implemented through other methods as well as the resistor R and the capacitor C.

Referring to FIG. 8B, at a time t1, the first logic signal $V_{LOG1}$ is changed from the Low level to the High level (i.e., $V_{LOG1}$ is changed from 0 to 1). That is, at the time t1, the first switch SW1 is changed from the turn-off state to the turn-on state. At this time, the signal at the input terminal A is immediately changed from the low level to the high level, but the signal at the input terminal B has a predetermined delay time based on the delay element 820 and is changed from the low level to the high level. Accordingly, based on the operation characteristic (High is output only when both inputs are High, and all other outputs Low) of the AND gate, the output terminal Y of the AND gate 810 is changed from the Low level to the High level after a predetermined delay time Δt. Accordingly, when the first switch SW1 is changed from the OFF state to the ON state, the turn-on of the first switch SW1 may be delayed by a predetermined delay time (Δt).

At a time t2, since both input terminals A and B of the AND gate 810 are at a high level, the output terminal Y of the AND gate 810 becomes the high level.

At a time t3, the first logic signal $V_{LOG1}$ is changed from the High level to the Low level ($V_{LOG1}$ is changed from 1 to 0). That is, at a time t3, the first switch SW1 is changed from the turn-on state to the turn-off state. At this time, the signal at the input terminal A is immediately changed from the High level to the Low level, but the signal at the input terminal B has a predetermined delay time based on the delay element 820, and is changed from the High level to the Low level. Accordingly, due to the operation characteristic (when only one of the two inputs is Low, Low is output) of the AND gate, the output terminal Y of the AND gate 810 is directly changed from the High level to the Low level (without the delay time).

In other words, the first delay circuit 222_a generates the delay of the output signal only when the first logic signal $V_{LOG1}$ is changed from the low level to the high level, and immediately generates the output signal when the first logic signal $V_{LOG1}$ is changed from the high level to the low level without the delay. The example that the first logic signal $V_{LOG1}$ is changed from the Low level to the High level is the example that the first switch SW1 is changed from the turn off state to the turn on state, and the first switch SW1 is turned on after the delay by a predetermined time Δt. Also, the example that the first logic signal $V_{LOG1}$ is changed from the High level to the Low level is the example that the first switch SW1 is changed from the turn on state to the turn off state, and the first switch SW1 is directly turned on without the delay time.

The second delay circuit 222_b receives the second logic signal $V_{LOG2}$ and outputs the second delay signal $V_{DEL2}$. As illustrated in FIG. 8A, the internal configuration of the second delay circuit 222_b is all the same as the first delay circuit 222_a except for receiving the second logic signal $V_{LOG2}$ so that the overlapped description is omitted. The second delay circuit 222_b generates the delay of the output signal only when the second logic signal $V_{LOG2}$ is changed from the Low level to the High level, and immediately generates the output signal without the delay when the second logic signal $V_{LOG2}$ is changed from the High level to the Low level.

By implementing the delay circuit 222 as described above, when the switching is changed between the first switch SW1 and the second switch SW2, the overlapping turn-on period, which is a period in which the first and second switches SW1 and SW2 are simultaneously turned on, may not occur.

In an example, when the first switch SW1 changes from the turn-off state to the turn-on state, and the second switch SW2 changes from the turn-on state to the turn-off state, the first switch SW1 is turned-on as late as the RC time constant, and the second switch SW2 is turned off immediately without the delay. That is, after the second switch SW2 is turned off first, and then the first switch SW1 is turned on.

Referring to FIG. 5, the switch driving circuit 223 receives the first and second delay signals $V_{DEL1}$ and $V_{DEL2}$ from the delay circuit 222, and outputs the switching driving signals $V_{sw1}$ and $V_{sw2}$. The switch driving circuit 223 converts the first delay signal $V_{DEL1}$ into the first switching driving signal $V_{sw1}$ and converts the second delay signal $V_{DEL2}$ to the second switching driving signal $V_{sw2}$. Since the first delay signal $V_{DEL1}$ and the second delay signal $V_{DEL2}$ as the logic signal have the low current level, the switch driving circuit 223 converts the first delay signal $V_{DEL1}$ and the second delay signal $V_{DEL2}$ into the first switching driving signal $V_{sw1}$ and the second switching driving signal $V_{sw2}$ having the high current level, respectively. As an example, the switch driving circuit 223 may be implemented as a level shift circuit and a buffer circuit.

When the first and second switches SW1 and SW2 are the p-type transistors, in the example that the first and second switching driving signals $V_{sw1}$ and $V_{sw2}$ are the low voltage (for example, 0 V or the negative (−) voltage), the first and second switches SW1 and SW2 are turned on. Additionally, when the first and second switching driving signals $V_{sw1}$ and $V_{sw2}$ are the high voltage (for example, 3 V), the first and second switches SW1 and SW2 are turned off. Accordingly, the switch driving circuit 223 may be implemented with one inverter buffer so as to output the high voltage when the delay signals $V_{DEL1}$ and $V_{DEL2}$ are the low level, and output the low voltage when the delay signals $V_{DEL1}$ and $V_{DEL2}$ are the high level.

When the first and second switches SW1 and SW2 are the n-type transistors, in the example that the first and second switching driving signals $V_{sw1}$ and $V_{sw2}$ are the low voltage (for example, 0 V or the negative (−) voltage), the first and second switches SW1 and SW2 are turned off. Additionally, when the first and second switching driving signals $V_{sw1}$ and $V_{sw2}$ are the high voltage (for example, 3 V), the first and second switches SW1 and SW2 are turned on. Accordingly, the switch driving circuit 223 may be implemented with two inverter buffers so as to output the low voltage when the delay signals $V_{DEL1}$ and $V_{DEL2}$ are the low level, and output the high voltage when the delay signals $V_{DEL1}$ and $V_{DEL2}$ are the high level.

Figure 9:
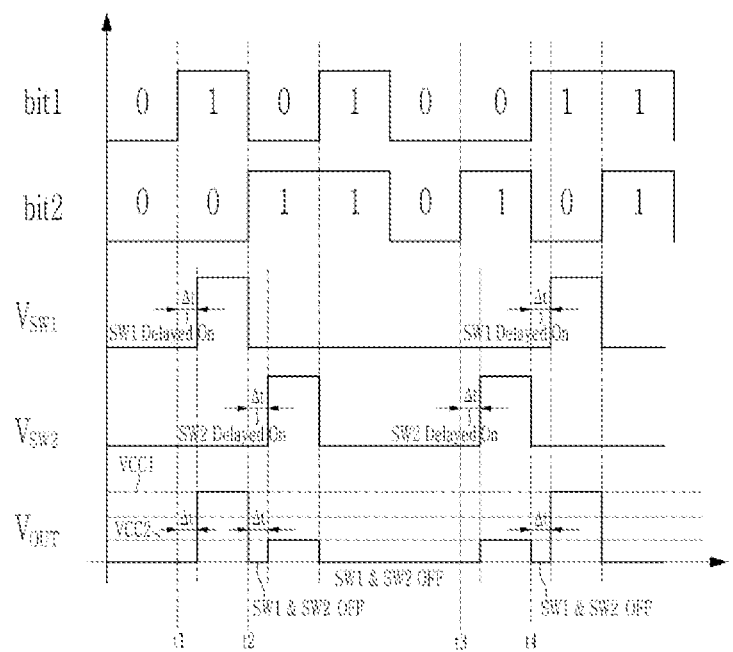
FIG. 9 illustrates an operation timing graph of an example power supply switch circuit, in accordance with one or more embodiments.

FIG. 9 illustrates an operation timing graph of a power supply switch circuit 200, in accordance with one or more embodiments. According to the bit signals Bit1 and Bit2 received from an external source, FIG. 9 illustrates the first switching driving signal $V_{sw1}$, the second switching driving signal $V_{sw2}$, and the power supply terminal voltage $V_{ouT}$.

At the time t1, the first switch SW1 is changed from the turn off state to the turn on state. As described in FIG. 8A and FIG. 8B, the delay circuit 222 generates the delay of the output signal when the logic signal is changed from the Low level to the High level (0 is changed to 1). Since the first logic signal $V_{LOG1}$ is changed from the low level to the high level, the first delay circuit 222_a causes the delay of the output signal. Accordingly, the first switching driving signal $V_{sw1}$ is changed from low voltage to high voltage after the predetermined delay time Δt, and the turn-on state of the first switch SW1 is delayed. Accordingly, the first power supply voltage VCC1 is applied to the power supply terminal T_VCC after the predetermined delay time Δt, and the power supply terminal voltage Vou is set to the first power supply voltage VCC1 after the predetermined delay time Δt.

At a time t2, the first switch SW1 is changed from the turn on state to the turn off state and the second switch SW2 is changed from the turn off state to the turn on state. As described in FIG. 8A and FIG. 8B, the delay circuit 222 generates the delay of the output signal when the logic signal is changed from the Low level to the High level (that is, changed from 0 to 1). Since the second logic signal $V_{LOG2}$ is changed from the low level to the high level, the second delay circuit 222_b causes the delay of the output signal. Accordingly, the second switching driving signal VSW2 is changed from the low voltage to the high voltage after a predetermined delay time Δt, and the turn-on state of the second switch SW2 is delayed. Accordingly, the second power supply voltage VCC2 is applied to the power supply terminal T_VCC after the predetermined delay time Δt, and the power supply terminal voltage $V_{OUT}$ is set as the second power supply voltage VCC2 after the predetermined delay time Δt. Since the first logic signal $V_{LOG1}$ is changed from the high level to the low level, the first delay circuit 222_a does not generate the delay of the output signal. Accordingly, the first switch SW1 is immediately turned off without the delay time. Accordingly, after the first switch SW1 is turned off first, the second switch SW2 is turned on, and overlapping-on period does not occur. In an example, during the predetermined delay time Δt, the first and second switches SW1 and SW2 maintain the turn-off state.

At the time of t3, the second switch SW2 is changed from the turn-off state to the turn-on state. As described in FIG. 8A and FIG. 8B, the delay circuit 222 generates the delay of the output signal when the logic signal is changed from the low level to the high level (that is, changed from 0 to 1). Since the second logic signal $V_{LOG2}$ is changed from the low level to the high level, the second delay circuit 222_b generates the delay of the output signal. Accordingly, the second switching driving signal VSW2 is changed from low voltage to high voltage after a predetermined delay time (Δt), and the turn-on state of the second switch SW2 is delayed. Accordingly, the second power supply voltage VCC2 is applied to the power supply terminal T_VCC after the predetermined delay time Δt, and the power supply terminal voltage $V_{OUT}$ is set as the second power supply voltage VCC2 after the predetermined delay time Δt.

At a time t4, the second switch SW2 changes from the turn-on state to the turn-off state, and the first switch SW1 changes from the turn-off state to the turn-on state. As described in FIG. 8A and FIG. 8B, the delay circuit 222 generates the delay of the output signal when the logic signal is changed from the Low level to the High level (that is, changed from 0 to 1). Since the first logic signal $V_{LOG1}$ changes from the low level to the high level, the first delay circuit 222_a causes the delay of the output signal. Accordingly, since the first switching driving signal VSW1 is changed from the low voltage to the high voltage after a predetermined delay time (Δt), the turn-on state of the first switch SW1 is delayed. Therefore, the first power supply voltage VCC1 is applied to the power supply terminal T_VCC after the predetermined delay time Δt, and the power supply terminal voltage $V_{OUT}$ is set as the first power supply voltage VCC1 after the predetermined delay time Δt. Since the second logic signal $V_{LOG2}$ is changed from a high level to a low level, the second delay circuit 222_b does not delay the output signal. Due to this, the second switch SW2 is immediately turned off without any delay time. Accordingly, after the second switch SW2 is first turned off, the first switch SW1 is turned on, and an overlapping-on period does not occur. In an example, the first and second switches SW1 and SW2 maintain the turn-off state during the predetermined delay time Δt.

As such, the power supply switch circuit 200, in accordance with one or more embodiments, does not simultaneously supply the first and second power supply voltages VCC1 and VCC2 to the power supply terminal when changing the signal from the first power supply voltage VCC1 to the second power supply voltage VCC2, and supplies it to the power supply terminal T_VCC. That is, when the first switch SW1 is changed to the turn-off state and the second switch SW2 is changed to the turn-on state, the overlapping-on period in which the first switch SW1 and the second switch SW2 are simultaneously turned on may not occur. Additionally, the power supply switch circuit 200, in accordance with one or more embodiments, may not simultaneously supply the first and second power supply voltages VCC1 and VCC2 to the power supply terminal even when changing from the second power supply voltage VCC2 to the first power supply voltage VCC1 to be supplied to the power supply terminal T_VCC. That is, when the first switch is changed to the turn-on state and the second switch is changed to the turn-off state, the overlapping-on period in which the first switch SW1 and the second switch SW2 are simultaneously turned on may not occur. In an example, when the switching is changed between the first switch SW1 and the second switch SW2, a current path may not be formed between the first power supply circuit 100a and the second power supply circuit 100b, thereby preventing the overcurrent from occurring.

Figure 10:
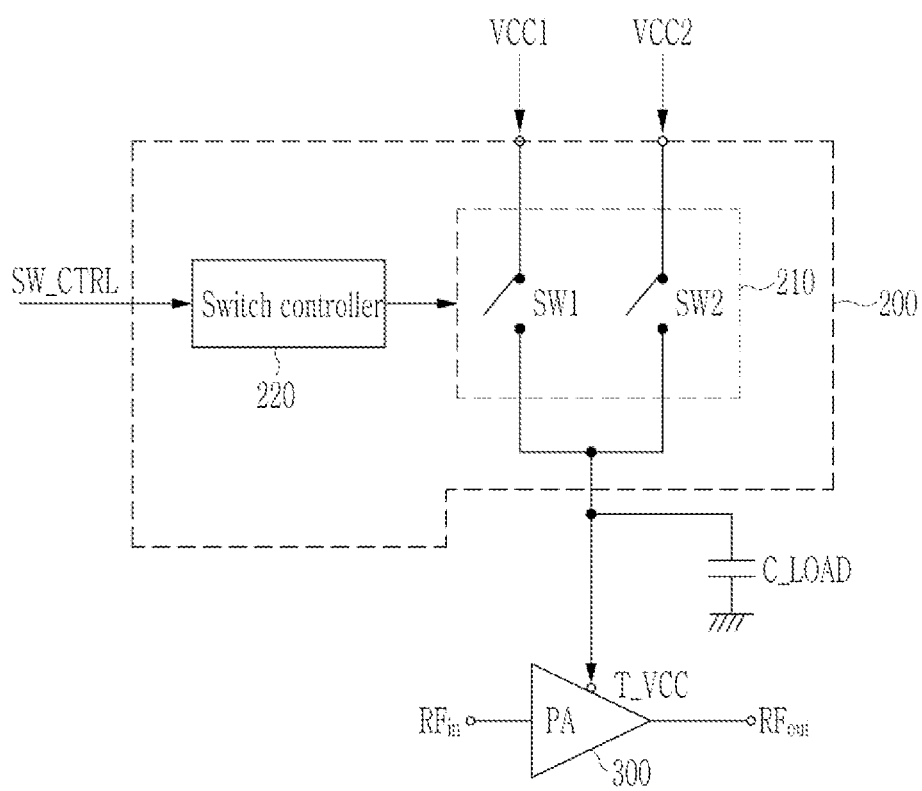
FIG. 10 illustrates a connection relationship of an example power supply capacitor, in accordance with one or more embodiments.

On the other hand, in FIG. 3, to stably supply the power supply voltage (VCC1 or VCC2), the power supply capacitor C_LOAD may be connected between the power supply terminal T_VCC and the ground. FIG. 10 is a view showing a connection relationship of a power supply capacitor C_LOAD according to an embodiment.

Referring to FIG. 10, the power supply capacitor C_LOAD may be connected between the power supply terminal T_VCC, to which the power supply voltage (VCC1 or VCC2) is applied, and the ground. The power supply voltage (VCC1 or VCC2), output from the power supply switch circuit 200, is charged in this power supply capacitor C_LOAD, and through this, the power supply voltage (VCC1 or VCC2) may be stably supplied to the power supply terminal T_VCC. Here, when the power supply capacitor C_LOAD is charged within a short rising time by the switch circuit 210, a current spike may occur. In order to prevent such a current spike, it may be necessary to adjust the turn-on rising time and the turn-off falling time of each switch SW1 and SW2, which is described below.

Figure 11:
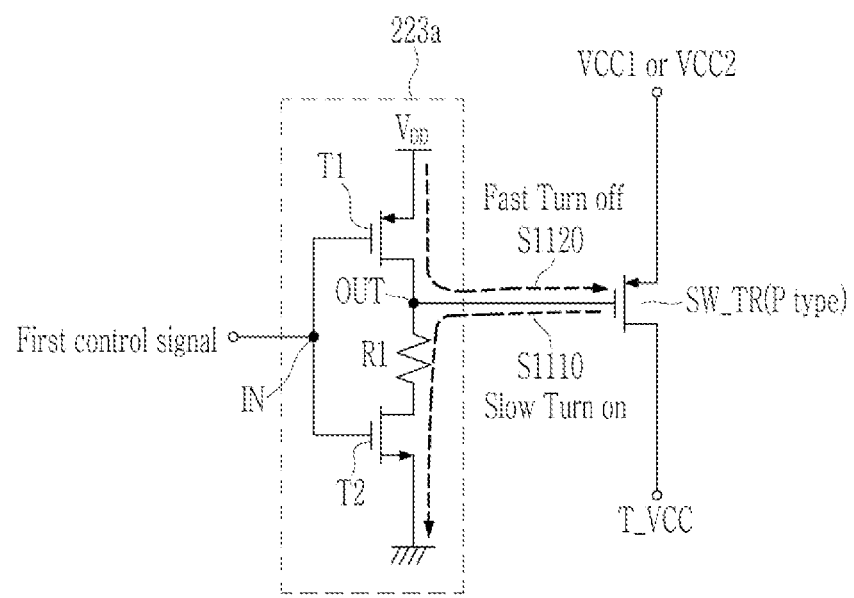
FIG. 11 illustrates an example switch driving circuit, in accordance with one or more embodiments.

FIG. 11 is a view illustrating a switch driving circuit 223a, in accordance with one or more embodiments.

A switch driving circuit 223a of FIG. 11 illustrates a switch driving circuit for an example in which the switch circuit 210 is implemented by a p-type transistor. In FIG. 11, the switch transistor SW_TR may be a p-type transistor, and the switch transistor SW_TR may be the first and second switches SW1 and SW2 described above. However, the examples are not limited thereto.

As illustrated in FIG. 11, the switch driving circuit 223a, in accordance with one or more embodiments, may include a first transistor T1, a second transistor T2, and a resistor R1.

The first transistor T1 may be a p-type transistor and may be a p-type FET as an example. The source of the first transistor T1 may be connected to the power supply voltage VDD, and the drain of the first transistor T1 may be connected to a first terminal of the resistor R1, and to a control terminal (i.e., a gate) of the switch transistor SW_TR. Additionally, the first control signal may be applied to the gate (the control terminal) of the first transistor T1.

The second transistor T2 may be an n-type transistor, and may be an n-type FET as an example. The drain of the second transistor T2 may be connected to a second terminal of the resistor R1, and the source of the second transistor T2 may be connected to the ground. Additionally, the first control signal may be applied to the gate (the control terminal) of the second transistor T2. In an example, the first terminal of the resistor R1 may be connected to the control terminal (i.e., the gate) of the switch transistor SW_TR. That is, the resistor R1 may be connected between the drain of the second transistor T2 and the control terminal of the switch transistor SW_TR. By implementing the resistor R1, the turn-on rising time of the switch transistor SW_TR may be increased.

On the other hand, in FIG. 11, in the switch driving circuit 223a, a terminal to which the first control signal is input may be an input terminal IN, and a terminal to which the output signal of the switch driving circuit 223a is output may be an output terminal OUT. At this point, the resistor R1 may be disposed between the output terminal OUT and the second transistor T2.

The first control signal is a signal that controls the turn-on state and the turn-off state of the switch transistor SW_TR and may have a high level and a low level. The first control signal is input to the input terminal IN of the switch driving circuit 223a. That is, the first control signal may be input to the control terminal of the first transistor T1 and the control terminal of the second transistor T2.

When the first control signal is at a high level, the first transistor T1 is turned off and the second transistor T2 is turned on. Accordingly, a turn-on path S1110 may be formed in the control terminal of the switch transistor SW_TR, the resistor R1, the second transistor T2, and the ground. The switch transistor SW_TR is turned on by this turn-on path S1110. In an example, the resistor R1 is positioned on the turn-on path S1110, and due to this, the turn-on rising time of the switch transistor SW_TR may be increased. A gate capacitance is formed at the control terminal (i.e., the gate) of the switch transistor SW_TR. The turn-on rising time of the switch transistor SW_TR may be increased by the gate capacitance and the RC time constant by the resistor R1. That is, the switch transistor SW_TR may be turned on slowly.

When the first control signal is at a low level, the first transistor T1 is turned on and the second transistor T2 is turned off. Accordingly, a turn-off path S1120 may be formed into the control terminal of the power supply voltage VDD, the transistor T1, and the switch transistor SW_TR. The switch transistor SW_TR is turned off by this turn-off path S1120. In an example, the resistor R1 may not be positioned on the turn-off path S1120, which may reduce the turn-off falling time of the switch transistor SW_TR. In an example, the turn-off falling time of the switch transistor SW_TR may be shorter than the turn-on rising time of the switch transistor SW_TR. That is, the switch transistor SW_TR may be quickly turned off.

Accordingly, the switch driving circuit 223a, in accordance with one or more embodiments, may increase the turn-on rising time of the switch transistor SW_TR by disposing the resistor R1 on the turn-on path. That is, the switch transistor SW_TR may be slowly turned on, and the current spike may be prevented.

Figure 12:
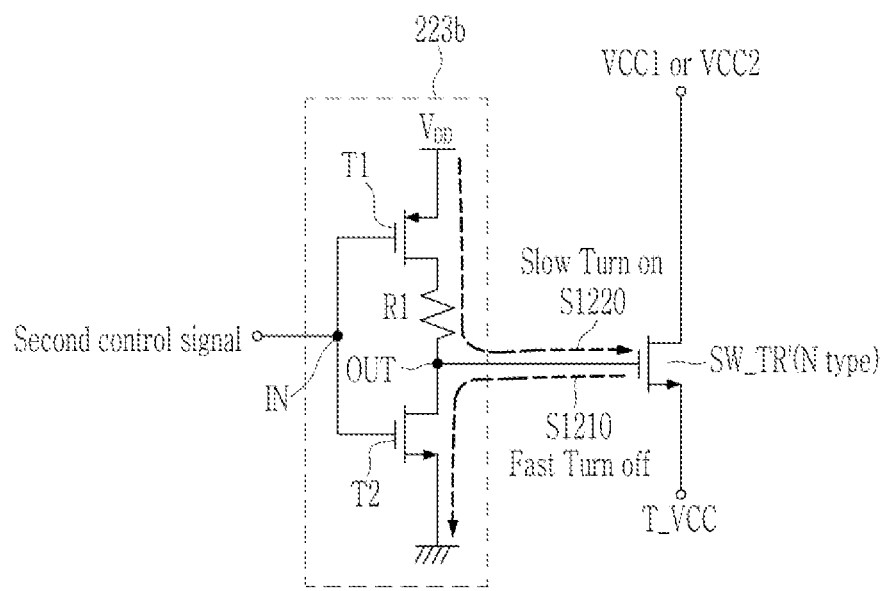
FIG. 12 illustrates an example switch driving circuit, in accordance with one or more embodiments.

FIG. 12 illustrates an example switch driving circuit 223b, in accordance with one or more embodiments.

The example switch driving circuit 223b in FIG. 12 represents a switch driving circuit when the switch circuit 210 is implemented as an n-type transistor. In FIG. 12, the switch transistor SW_TR' may be the n-type transistor, and the switch transistor SW_TR' may be the first and second switches SW1 and SW2 above-described.

As illustrated in FIG. 12, the switch driving circuit 223b, in accordance with one or more embodiments, may include a first transistor T1, a second transistor T2, and a resistor R1. The switch driving circuit 223b of FIG. 12 may be similar to the switch driving circuit 223a of FIG. 11 except for the changed position of the resistor R1.

In a non-limited example, the first transistor T1 may be a p-type transistor and may be a p-type FET as an example. The source of the first transistor T1 may be connected to the power supply voltage VDD, and the drain of the first transistor T1 may be connected to a first terminal of the resistor R1. The second control signal may be applied to the gate (the control terminal) of the first transistor T1. In an example, the second terminal of the resistor R1 may be connected to the control terminal (i.e., the gate) of the switch transistor SW_TR'. That is, the resistor R1 may be connected between the drain of the first transistor T1 and the control terminal of the switch transistor SW_TR'. By implementing the resistor R1, the turn-on rising time of the switch transistor SW_TR' may be increased.

In a non-limited example, the second transistor T2 may be an n-type transistor, and may be an n-type FET as an example. The drain of second transistor T2 may be connected to the control terminal of switch transistor SW_TR'), and the source of the second transistor T2 may be connected to the ground. The second control signal may be applied to the gate (the control terminal) of the second transistor T2.

In FIG. 12, a terminal to which the second control signal is input from the switch driving circuit 223b may be an input terminal IN, and a terminal to which the output signal of the switch driving circuit 223b is output may be an output terminal OUT. At this point, the resistor R1 may be disposed between the output terminal OUT and the first transistor T1.

The second control signal is a signal that controls the turn-on state and the turn-off state of the switch transistor SW_TR', and may have a high level and a low level. The second control signal is input to the input terminal IN of the switch driving circuit 223b. That is, the second control signal may be input to the control terminal of the first transistor T1 and the control terminal of the second transistor T2. The phase of the second control signal may be opposite to the phase of the first control signal.

When the second control signal is at a high level, the first transistor T1 is turned off and the second transistor T2 is turned on. Accordingly, a turn-off path S1210 may be formed into the control terminal of the switch transistor SW_TR', the second transistor T2, and the ground. The switch transistor SW_TR' is turned off by the turn-off path S1210. In an example, the resistor R1 is not positioned on the turn-off path S1210, which may reduce the turn-off falling time of the switch transistor SW_TR'. That is, the switch transistor SW_TR' may be quickly turned off.

When the second control signal is at a low level, first transistor T1 is turned on and second transistor T2 is turned off. Accordingly, a turn-on path S1220 may be formed into the control terminal of the power supply voltage VDD, the transistor T1, the resistor R1, and the switch transistor SW_TR'. The switch transistor SW_TR' is turned on by the turn-on path S1220. In an example, the resistor R1 is positioned on the turn-on path S1220, and accordingly, the turn-on rising time of the switch transistor SW_TR' may be increased. A gate capacitance may be formed at the control terminal (i.e., the gate) of the switch transistor SW_TR'. The turn-on rising time of the switch transistor SW_TR' may be increased by the gate capacitance and the RC time constant by the resistor R1. That is, the switch transistor SW_TR' may be turned on slowly. In an example, the turn-on rising time of the switch transistor SW_TR' may be longer than the turn-off falling time of the switch transistor SW_TR'.

Accordingly, the switch driving circuit 223b, in accordance with one or more embodiments, may also increase the turn-on rising time of the switch transistor SW_TR') by disposing the resistor R1 on the turn-on path. That is, the switch transistor SW_TR' may be turned on slowly, and the current spike may be prevented.

Figure 13:
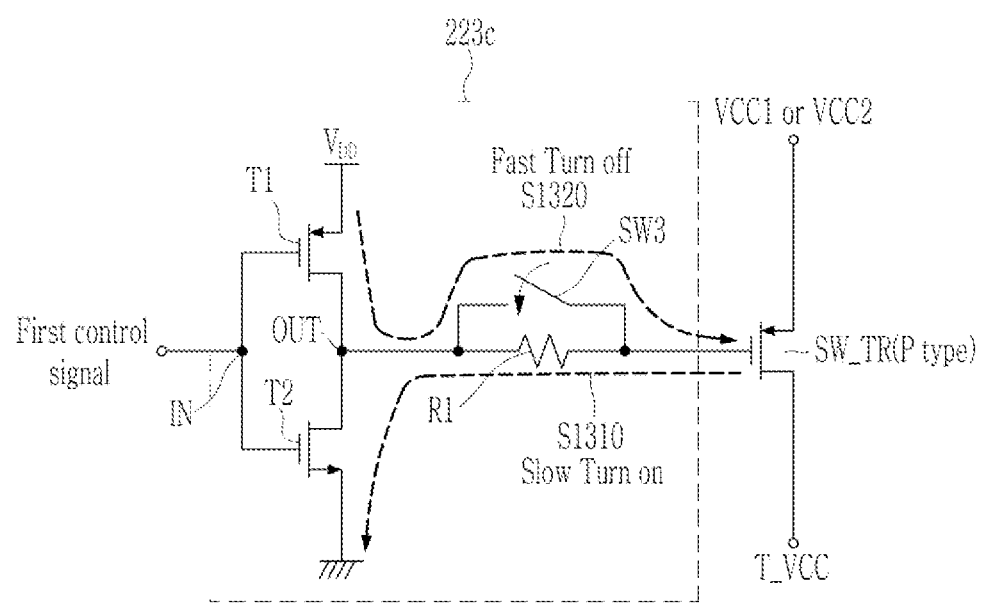
FIG. 13 illustrates an example switch driving circuit, in accordance with one or more embodiments.

FIG. 13 illustrates an example switch driving circuit 223c, in accordance with one or more embodiments.

The switch driving circuit 223c in FIG. 13 represents a switch driving circuit when the switch circuit 210 is implemented as a p-type transistor. In FIG. 13, the switch transistor SW_TR may be a p-type transistor, and the switch transistor SW_TR may be the first and second switches SW1 and SW2 described above.

As illustrated in FIG. 13, the switch driving circuit 223c, in accordance with one or more embodiments, may include a first transistor T1, a second transistor T2, a resistor R1, and a switch SW3.

In an example, the first transistor T1 may be a p-type transistor and may be a p-type FET as an example. The source of the first transistor T1 may be connected to the power supply voltage VDD, and the drain of the first transistor T1 may be connected to the drain of second transistor T2. Additionally, the first control signal may be applied to the gate (the control terminal) of the first transistor T1.

The second transistor T2 may be an n-type transistor, and may be an n-type FET as an example. The drain of the second transistor T2 may be connected to the drain of first transistor T1, and the source of the second transistor T2 may be connected to the ground. Additionally, the first control signal may be applied to the gate (the control terminal) of the second transistor T2.

A first terminal of the resistor R1 may be connected to the drain of the first transistor T1 and the drain of the second transistor T2, and the second terminal of the resistor R1 may be connected to the control terminal of the switch transistor SW_TR. That is, the resistor R1 may be connected between a node between the drain of the first transistor T1 and the drain of the second transistor T2, and the control terminal of the switch transistor SW_TR. The first transistor T1 and the second transistor T2 may form a gate driver, and from this point of view, a node between the drain of the first transistor T1 and the drain of the second transistor T2 may be an output terminal OUT.

The switch SW3 may be coupled in parallel to both terminals of the resistor R1. The switch SW3 is turned off when the switch transistor SW_TR is turned on and turned on when the switch transistor SW_TR is turned off. By combining the resistor R1 and the switch SW3, the turn-on rising time of switch transistor SW_TR may be increased.

In an example, the first control signal of FIG. 13 may be the same as the first control signal of FIG. 11. The first control signal of FIG. 13 may be a signal to control the turn-on state and the turn-off state of the switch transistor SW_TR and have a high level and a low level. The first control signal of FIG. 13 may be input to the input terminal IN of the switch driving circuit 223a.

When the first control signal is at a high level, the first transistor T1 is turned off and the second transistor T2 is turned on. At this time, the switch SW3 is turned off. Accordingly, a turn-on path S1310 may be formed into the control terminal of the switch transistor SW_TR, the resistor R1, the second transistor T2, and the ground. The switch transistor SW_TR is turned on by this turn-on path S1310. In an example, the resistor R1 is positioned on the turn-on path S1310, and accordingly, the turn-on rising time of the switch transistor SW_TR may be increased. The gate capacitance of the switch transistor SW_TR is formed in the control terminal (i.e., the gate). By the RC time constant by the gate capacitance and the resistor R1, the turn-on rising time of the switch transistor SW_TR may be increased. That is, the switch transistor SW_TR may be turned on slowly.

When the first control signal is at a low level, the first transistor T1 is turned on and the second transistor T2 is turned off. At this time, switch SW3 is turned on. Accordingly, a turn-off path S1320 may be formed into the control terminal of the power supply voltage VDD, the transistor T1, the switch SW3, and the switch transistor SW_TR. The switch transistor SW_TR is turned off by the turn-off path S1320. In an example, the resistor R1 may not be positioned on the turn-off path S1320, which may reduce the turn-off falling time of the switch transistor SW_TR. In an example, the turn-off falling time of the switch transistor SW_TR may be shorter than the turn-on rising time of the switch transistor SW_TR. That is, the switch transistor SW_TR may be quickly turned off.

The switch driving circuit 223c, in accordance with one or more embodiments, may increase the turn-on rising time of the switch transistor SW_TR by disposing the resistor R1 on the turn-on path. That is, the switch transistor SW_TR may be slowly turned on, and the current spike may be prevented.

Figure 14:
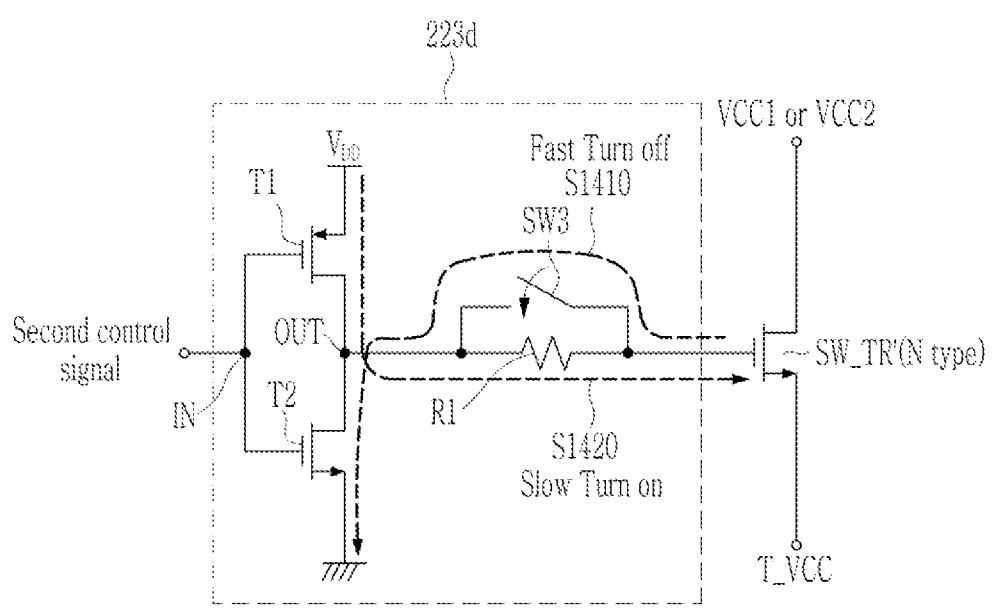
FIG. 14 illustrates an example switch driving circuit, in accordance with one or more embodiments.

FIG. 14 illustrates an example switch driving circuit 223d, in accordance with one or more embodiments.

The example switch driving circuit 223d of FIG. 14 represents a switch driving circuit when the switch circuit 210 is implemented by an n-type transistor. In FIG. 14, the switch transistor SW_TR') is an n-type transistor, and the switch transistor SW_TR' may be first and second switches SW1 and SW2 described above.

As illustrated in FIG. 14, a switch driving circuit 223d, in accordance with one or more embodiments, may include a first transistor T1, a second transistor T2, a resistor R1, and a switch SW3. The switch driving circuit 223d of FIG. 14 is similar in the composition and the connection to the switch driving circuit 223c in FIG. 13, but there is a slight difference in the operation of the switch SW3 and the second control signal being applied to the input terminal IN.

The second control signal of FIG. 14 may be the same as the second control signal of FIG. 12. The second control signal of FIG. 14 is a signal that controls the turn-on state and the turn-off state of the switch transistor SW_TR'), and may have a high level and a low level. The second control signal of FIG. 14 is input to the input terminal IN of the switch driving circuit 223d.

When the second control signal is at a high level, the first transistor T1 is turned off and the second transistor T2 is turned on. At this time, the switch SW3 is turned on. Accordingly, a turn-off path S1410 may be formed into the control terminal of the switch transistor SW_TR', the switch SW3, the second transistor T2, and the ground. The switch transistor SW_TR' is turned off by this turn-off path S1410.

In an example, the resistor R1 is not positioned on the turn-off path S1410, which may reduce the turn-off falling time of the switch transistor SW_TR'). That is, the switch transistor SW_TR' may be quickly turned off.

When the second control signal is at a low level, the first transistor T1 is turned on and the second transistor T2 is turned off. At this time, the switch SW3 is turned off. Accordingly, a turn-on path S1420 may be formed into the control terminal of the power supply voltage VDD, the transistor T1, the resistor R1, and the switch transistor SW_TR'. The switch transistor SW_TR' is turned on by this turn-on path S1420. In an example, the resistor R1 is positioned on the turn-on path S1420, and due to this, the turn-on rising time of the switch transistor SW_TR' may be increased. A gate capacitance is formed at the control terminal (i.e., the gate) of the switch transistor SW_TR'. The turn-on rising time of the switch transistor SW_TR' may be increased by the gate capacitance and the RC time constant by the resistor R1. That is, the switch transistor SW_TR' may be turned on slowly. In an example, the turn-on rising time of the switch transistor SW_TR' may be longer than the turn-off falling time of the switch transistor SW_TR'.

Accordingly, the switch driving circuit 223d, in accordance with one or more embodiments, may increase the turn-on rising time of the switch transistor SW_TR' by disposing the resistor R1 on the turn-on path. That is, the switch transistor SW_TR' may be turned on slowly, and the current spike may be prevented.

Figure 15:
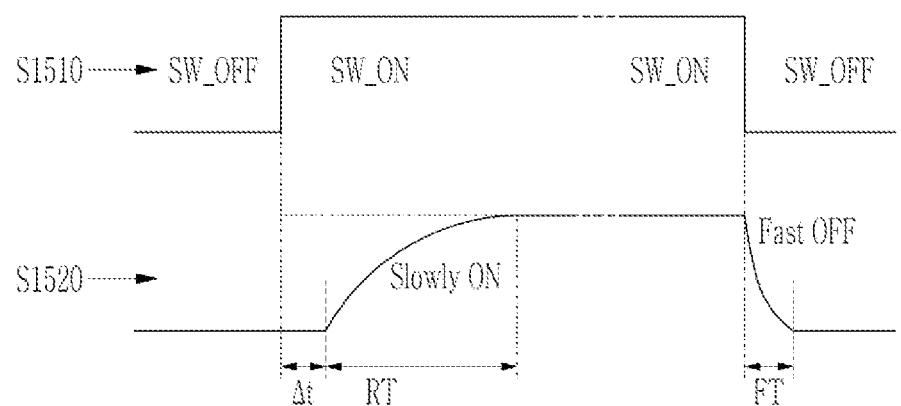
FIG. 15 illustrates a timing graph for a turn-on and a turn-off of a switch transistor, in accordance with one or more embodiments.

FIG. 15 is a timing graph for a turn-on and turn-off of a switch transistor, in accordance with one or more embodiments. In an example, the switch transistor may be the switch transistor SW_TR or the switch transistor SW_TR' described in FIG. 11 to FIG. 14.

In FIG. 15, S1510 may be the control signal of the switch transistor and the first control signal or the second control signal described in FIG. 11 to FIG. 14. S1520 represents the turn-on/turn-off timing of the switch transistor for the example where the delay circuit described in FIG. 8A and FIG. 8B is applied and the switch driving circuit described in FIG. 11 to FIG. 14 is applied.

Referring to S1520 of FIG. 15, when turning on the switch transistor, a predetermined delay time (Δt) described in FIG. 8A and FIG. 8B may be generated.

Additionally, referring to S1520 of FIG. 15, the turn-on rising time RT of the switch transistor may be generated, and the turn-off falling time FT of the switch transistor may be generated. As described in FIG. 11 to FIG. 14, the turn-on rising time may be increased, and the turn-on rising time RT is longer than the turn-off falling time FT. That is, the switch transistor may be turned on slowly and turned off quickly.

Figure 16:
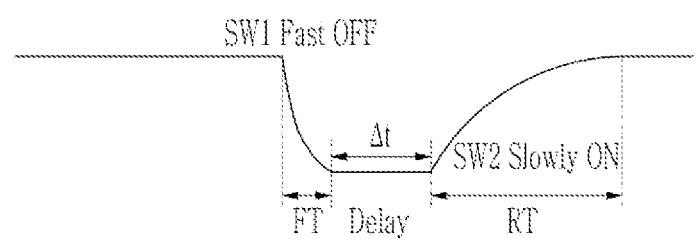
FIG. 16 illustrates a timing graph during a switching between a first switch and a second switch, in accordance with one or more embodiments.

FIG. 16 is a timing graph during a switching between a first switch SW1 and a second switch SW2.

When the first switch SW1 is turned off, as described in FIG. 11 to FIG. 14, it may be turned off quickly. That is, the first switch SW1 may have a turn-off falling time FT at the time of the turn-off. When the second switch SW2 turns on, as described in FIG. 8A and FIG. 8B, a predetermined delay time (Δt) may occur. Also, the second switch SW2 may be turned on slowly after a predetermined delay time (Δt). That is, when the second switch SW2 is turned on, it may have a turn-on rising time RT with a predetermined delay time (Δt). Here, the turn-on rising time RT of the second switch SW2 may be longer than the turn-off falling time FT of the first switch SW1.

Hereinafter, the method for preventing the current spike described above and other methods will be described. Each of the first and second switches SW1 and SW2 included in the switch circuit 210 may include a plurality of transistor cells. The current spike may be prevented by first turning on some transistor cells within a plurality of transistor cells and then turning on the remaining transistor cells later. This is described in detail with reference to FIG. 17.

Figure 17:
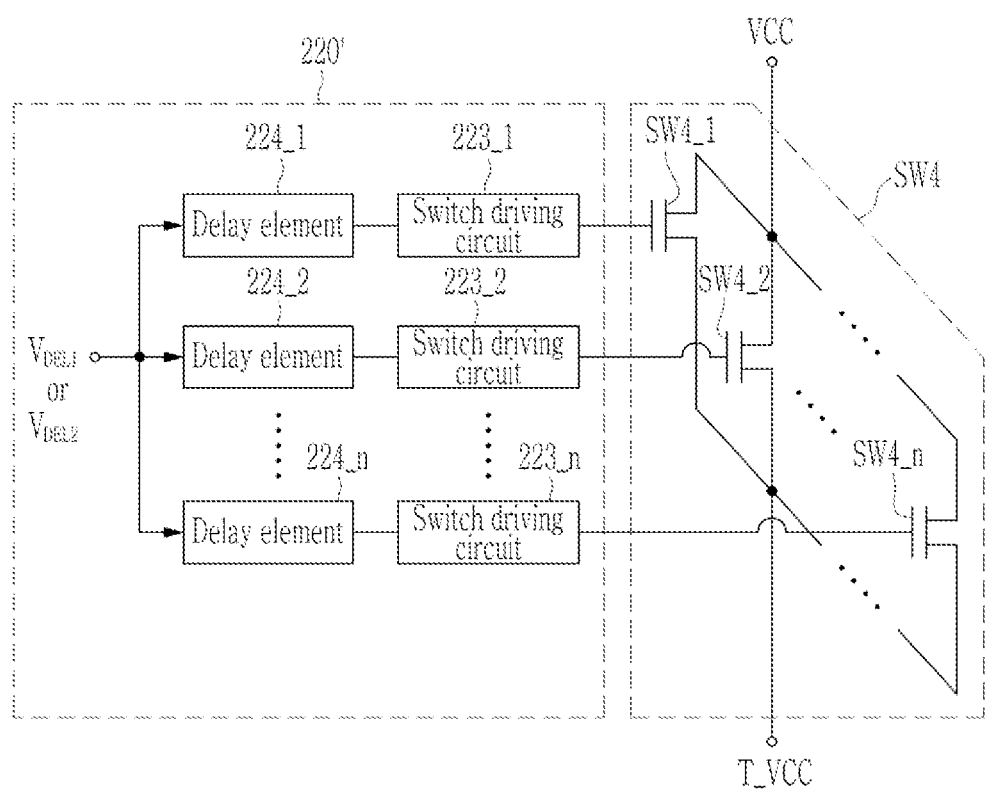
FIG. 17 illustrates an example switch and an example switch controller, in accordance with one or more embodiments.

FIG. 17 illustrates an example switch SW4 and an example switch controller 220', in accordance with one or more embodiments.

Referring to FIG. 17, the switch SW4 may be one of the first and second switches SW1 and SW2 described above. Additionally, the power supply voltage VCC may be any one of the first power supply voltage VCC1 and the second power supply voltage VCC2 described above.

The switch SW4 may include a plurality of transistor cells SW4_1 to SW4_n. In an example, n is a natural number of two or more. A plurality of transistor cells SW4_1 to SW4_n may be coupled in parallel, and each of a plurality of transistor cells SW4_1 to SW4_n may be connected between the power supply voltage VCC and the power supply terminal T_VCC. After at least one transistor cell of a plurality of transistor cells SW4_1 to SW4_n may be turned on first, the remaining transistor cells may be turned on. A plurality of transistor cells SW4_1 to SW4_n may be sequentially turned on. In this way, through a difference in the turn-on timing within a plurality of transistor cells SW4_1 to SW4_n, the switch SW4 may be slowly turned on as a whole. Due to this, the current spike may be reduced.

The switch controller 220' may include a plurality of switch driving circuits 223_1 to 223_n and a plurality of delay elements 224_1 to 224_n. On the other hand, although not shown in FIG. 17, the switch controller 220' may further include the logic circuit 221 and the delay circuit 222 of FIG. 5.

Each of a plurality of switch driving circuits 223_1 to 223_n may be connected to the control terminal (i.e., the gate terminal) of each of a plurality of transistor cells SW4_1 to SW4_n. That is, each of a plurality of switch driving circuits 223_1 to 223_n is a circuit driving each of a plurality of transistor cells SW4_1 to SW4_n. In an example, each of a plurality of switch driving circuits 223_1 to 223_n may be one among the switch driving circuit 223a, the switch driving circuit 223b, the switch driving circuit 223c, and the switch driving circuit 223d described in FIG. 11 to FIG. 14.

A plurality of delay elements 224_1 to 224_n may receive the first delay signal $V_{DEL1}$ or the second delay signal $V_{DEL1}$ described in FIG. 5. Each of the plurality of delay elements 224_1 to 224_n may generate the time delay for the first delay signal $V_{DEL1}$ or the second delay signal $V_{DEL1}$. In an example, a plurality of delay elements 224_1 to 224_n may be an element configured separately from the delay circuit 222 of FIG. 5. That is, a plurality of delay elements 224_1 to 224_n may be an element configured separately from the delay element 820 of FIG. 8.

Among a plurality of delay elements 224_1 to 224_n, at least one delay element may generate a predetermined time delay TD1 and the remaining delay elements may generate a time delay TD2. Here, the time delay TD2 may be longer than the time delay TD1. Through such a time delay, at least one transistor cell among a plurality of transistor cells SW4_1 to SW4_n may be turned on first, and then the remaining transistor cells may be turned on.

In an example, each of a plurality of delay elements 224_1 to 224_n may generate different time delays. Through such a time delay, a plurality of transistor cells SW4_1 to SW4_n may be sequentially turned on.

Since a method for generating the time delay by a plurality of delay elements 224_1 to 224_n may be known to a person of ordinary skill in the art, a detailed description thereof will be omitted. As an example, each of a plurality of delay elements 224_1 to 224_n may include a resistor and a capacitor that generate an RC time constant, and the time delay may occur according to the value of the resistor and the value of the capacitor. As an example, each of a plurality of delay elements 224_1 to 224_n may have the same configuration as the delay element 820 of FIG. 8A, and the value of the resistor and the value of the capacitor may be determined according to the predetermined time delay.

While this disclosure includes specific examples, it will be apparent to one of ordinary skill in the art, after an understanding of the disclosure, that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A power supply switch circuit, comprising:
a first switch configured to switch a supply of a first power supply voltage to a power supply terminal of a power amplifier; and
a switch driving circuit including a first transistor configured to turn on the first switch, and a second transistor configured to turn off the first switch,
wherein the switch driving circuit further includes a first resistor positioned on a turn-on path that is formed between the first transistor and the first switch when the first transistor is turned on,
wherein a first terminal of the second transistor is connected to a second power supply voltage, and a second terminal of the second transistor is connected to a control terminal of the first switch,
wherein a second terminal of the first transistor is connected to a ground, and
wherein the first resistor is connected between a second terminal of the first transistor and the control terminal of the first switch.

2. The power supply switch circuit of claim 1, wherein:
a turn-on rising period of the first switch is longer than a turn-off falling period of the first switch.

3. The power supply switch circuit of claim 2, wherein:
the turn-on rising period of the first switch is determined by a value of the first resistor and a capacitance value formed at a control terminal of the first switch.

4. The power supply switch circuit of claim 1, wherein:
the first resistor is not positioned on a turn-off path that is formed between the second transistor and the first switch when the second transistor is turned on.

5. The power supply switch circuit of claim 1, wherein:
the first switch is a p-type transistor, and a control signal that controls the first switch is input to a control terminal of the first transistor and a control terminal of the second transistor.

6. The power supply switch circuit of claim 1, wherein:
the switch driving circuit further includes a second switch connected in parallel to a first terminal and a second terminal of the first resistor, and
the second switch is configured to turn off when the first transistor is turned on and is configured to turn on when the second transistor is turned on.

7. The power supply switch circuit of claim 6, wherein:
the first resistor is connected between a node where the first transistor and the second transistor are connected to each other and a control terminal of the first switch.

8. A power supply switch circuit, comprising:
a first switch configured to switch a supply of a first power supply voltage to a power supply terminal of a power amplifier; and
a switch driving circuit including a first transistor configured to turn on the first switch, and a second transistor configured to turn off the first switch,
wherein the switch driving circuit further includes a first resistor positioned on a turn-on path that is formed between the first transistor and the first switch when the first transistor is turned on,
wherein the first switch includes a plurality of transistors connected in parallel with each other, and
wherein after at least one transistor among the plurality of transistors is turned on first, at least one transistor different from the at least one transistor among the plurality of transistors is turned on.

9. The power supply switch circuit of claim 1, further comprising:
a second switch configured to switch a supply of a second power supply voltage to the power supply terminal of the power amplifier, and
when the first switch is turned off and the second switch is turned on, the second switch is turned on after the first switch is turned off.

10. The power supply switch circuit of claim 9, further comprising:
a delay circuit configured to delay a first logic signal that controls the first switch and delay a second logic signal that controls the second switch.

11. The power supply switch circuit of claim 10, wherein:
the delay circuit comprises:
a first delay circuit including a first delay element configured to delay the first logic signal, and a first AND gate that receives the first logic signal and a signal delayed by the first delay element, and
a second delay circuit including a second delay element configured to delay the second logic signal, and a second AND gate that receives the second logic signal and a signal delayed by the second delay element.

12. A switch driving circuit, comprising:
a first transistor configured to turn on a first switch that switches a supply of a power supply voltage to a power supply terminal of a power amplifier;
a second transistor configured to turn off the first switch;
a first resistor positioned on a turn-on path formed between the first transistor and the first switch when the first switch is turned on; and
a second switch connected in parallel to a first terminal and a second terminal of the first resistor, wherein the second switch is turned off when the first transistor is turned on and is turned on when the second transistor is turned on.

13. The switch driving circuit of claim 12, wherein:
a turn-on rising period of the first switch is longer than a turn-off falling period of the first switch.

\* \* \* \* \*